(12) United States Patent
Kim

(10) Patent No.: US 7,659,755 B1
(45) Date of Patent: Feb. 9, 2010

(54) METHOD AND APPARATUS INCLUDING A DRIVER FOR DRIVING A FLOATING BIPOLAR SWITCH

(75) Inventor: Chun-Sup Kim, San Jose, CA (US)

(73) Assignee: Ikanos Communications Inc., Fremont, CA (US)

( * ) Notice: Subject to any disclaimer, the term of this patent is extended or adjusted under 35 U.S.C. 154(b) by 30 days.

(21) Appl. No.: 12/006,158

(22) Filed: Dec. 31, 2007

Related U.S. Application Data

(60) Provisional application No. 60/877,955, filed on Dec. 30, 2006.

(51) Int. Cl.
*H03K 3/00* (2006.01)

(52) U.S. Cl. .......................... 327/108; 326/82

(58) Field of Classification Search ................. 327/108, 327/109, 110, 111, 112; 326/82, 83
See application file for complete search history.

(56) References Cited

U.S. PATENT DOCUMENTS

| | | | | |
|---|---|---|---|---|
| 3,215,859 A | * | 11/1965 | Sorchych | ..................... 327/427 |
| 4,682,061 A | * | 7/1987 | Donovan | ..................... 327/434 |
| 4,814,644 A | * | 3/1989 | Yamakawa | .................... 327/64 |
| 5,414,382 A | | 5/1995 | Larson et al. | |
| 6,556,063 B2 | * | 4/2003 | Wyland | ..................... 327/434 |
| 6,597,592 B2 | | 7/2003 | Carsten | |
| 7,119,586 B2 | | 10/2006 | Hornkamp | |
| 7,271,614 B2 | | 9/2007 | Khoo et al. | |

* cited by examiner

*Primary Examiner*—Kenneth B. Wells
(74) *Attorney, Agent, or Firm*—IP Creators; Charles C Cary

(57) ABSTRACT

A switch for switchably coupling a signal source to a high impedance load. The switch includes a first bipolar transistor and a floating switch driver. The first bipolar transistor is configured to switchably couple the signal source to the high impedance load responsive to a driver signal applied to a base thereof. The floating switch driver has a control input and an output terminal coupled to the base of the first bi-polar transistor to supply the driver signal thereto. The driver signal comprises a limited forward current during the "On" state of the floating switch driver and a voltage "Voff" not less than the reverse breakdown voltage nor greater than the forward voltage drop across a base-emitter connection of the first bipolar transistor during the "Off" state of the floating switch driver.

15 Claims, 4 Drawing Sheets

OFF = LOW POWER

ON = LOW NOISE

METHOD AND APPARATUS INCLUDING A DRIVER FOR DRIVING A FLOATING BIPOLAR SWITCH

CROSS REFERENCE TO RELATED APPLICATION

This application claims the benefit of prior filed co-pending Provisional Application No. 60/877,955 filed on Dec. 30, 2006 entitled "Buffered Bipolar Floating switch Circuit with Low Power Consuming Characteristic" which is incorporated herein by reference in its entirety as if fully set forth herein.

BACKGROUND OF THE INVENTION

1. Field of Invention

The present invention is generally related to analog electronic circuits, and more particularly to circuits including switchably coupled operational amplifiers.

2. Description of the Related Art

A typical communication system includes digital signal processing core coupled to an analog stage for driving digital data onto a wired or wireless communication medium. Typically the characteristics of the communication medium vary greatly and the designer must oversize the analog stage to accommodate those communications mediums which require the highest power, gain and other transmission characteristics. An analog stage offers none of the flexibility or adaptability of its digital counterpart.

What is needed are improvements in the flexibility and dynamic configurability of analog stages to accommodate varying power, gain and analog signal processing requirements of a given communication medium.

SUMMARY OF THE INVENTION

A method and apparatus is disclosed for a switch driver for switched analog circuits configurable to adapt to differing power, gain, and signal conditioning requirements of an associated communication system and or communication medium. In an embodiment of the invention a switch is disclosed for switchably coupling a signal source to a high impedance load. The switch includes a first bipolar transistor and a floating switch driver. The first bipolar transistor is configured to switchably couple the signal source to the high impedance load responsive to a driver signal applied to a base thereof. The floating switch driver has a control input and an output terminal coupled to the base of the first bi-polar transistor to supply the driver signal thereto. The driver signal comprises a limited forward current during the "On" state of the floating switch driver and a voltage "Voff" not less than the reverse breakdown voltage nor greater than the forward voltage drop across a base-emitter connection of the first bipolar transistor during the "Off" state of the floating switch driver.

BRIEF DESCRIPTION OF THE DRAWINGS

These and other features and advantages of the present invention will become more apparent to those skilled in the art from the following detailed description in conjunction with the appended drawings in which.

DETAILED DESCRIPTION OF THE EMBODIMENTS

A method and apparatus is disclosed for a switch driver for switched analog circuits configurable to adapt to differing power, gain, and signal conditioning requirements of an associated communication system and or communication medium. The approach is of particular advantage in configuring the analog stage of communication systems to match the gain, power, signal conditioning and other characteristics of a discrete wired or wireless communication medium.

Figures 1A, 1B:
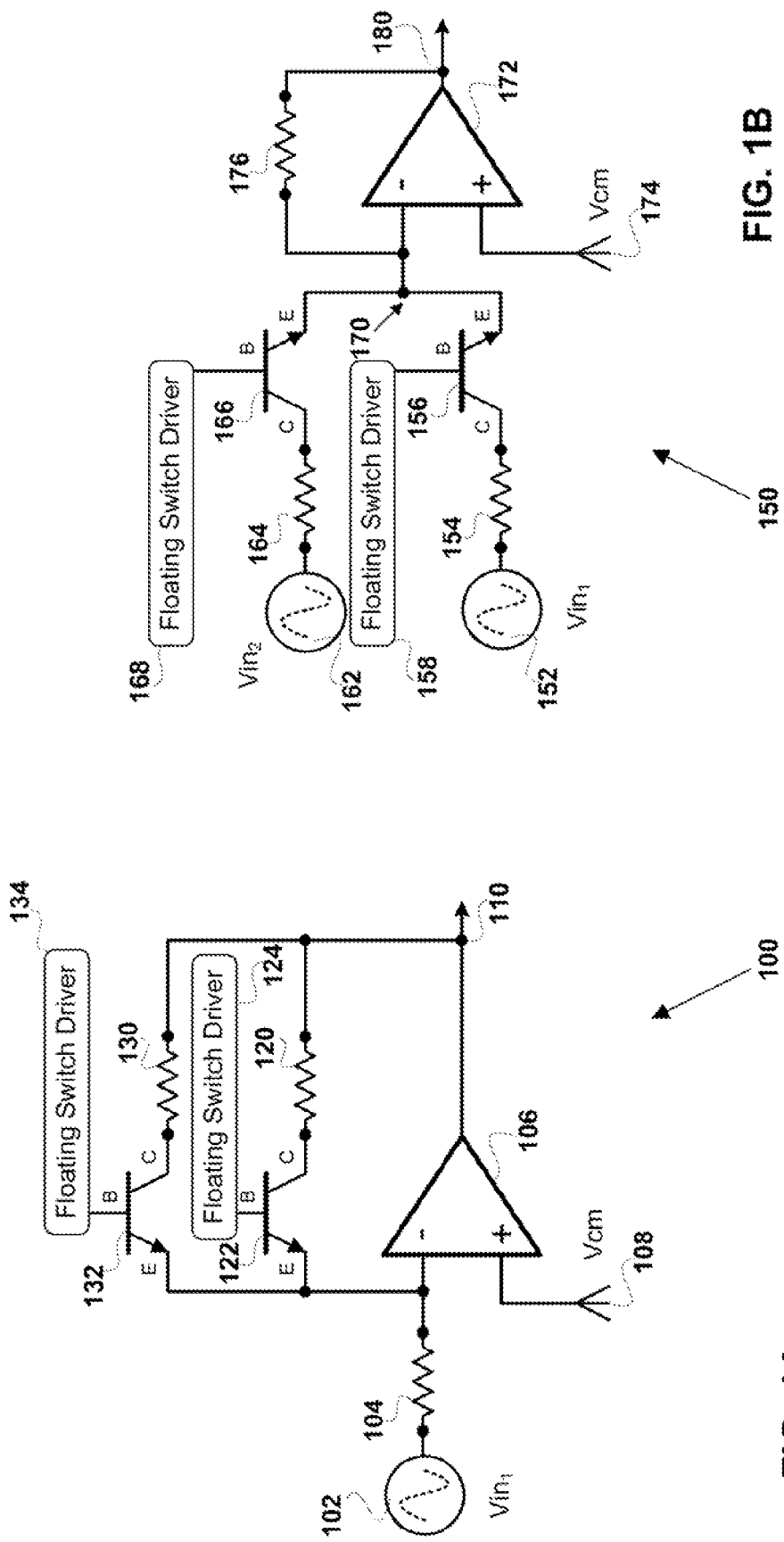
FIG. 1A is a hardware block diagram of an embodiment of the invention incorporating the floating switch driver into selectable feedback loops of an operational amplifier.
FIG. 1B is a hardware block diagram of another embodiment of the invention incorporating the floating switch driver into selectable signal inputs of an operational amplifier.

FIG. 1A is a hardware block diagram of an embodiment of the invention in which a programmable gain amplifier 100 incorporates floating switch drivers 124, 134 into selectable feedback loops of an operational amplifier, a.k.a. op amp 106 to select the gain. The non-inverting input of the op amp is connected to a common mode voltage ($V_{cm}$) 108. The gain of the operational amplifier may be selected by switchably coupling or uncoupling the associated feedback loop to the inverting input of the op amp. An input signal source 102 is shown coupled to the inverting input of the op amp 106 via resistor 104. The gain of the signal at the output 110 of the op amp is determined by the resistance associated with the feedback loop as follows. $V_{gain}=(R_{fbk}/R_{in})$. Where $R_{in}$ in this case is resistor 104 and $R_{fbk}$ is the selected one(s) of feedback resistors 120 and 130 each of which may be switchably coupled to or uncoupled from the inverting input of the op-amp by an associated one of bipolar junction transistors 122 and 132 respectively. The floating switch driver 124 couples to the base of BJT 122 to deliver a drive signal thereto which enables or disables the associated feedback loop which includes resistor 120. The floating switch driver 134 couples to the base of BJT 132 to deliver a drive signal thereto which enables or disables the associated feedback loop which includes resistor 130.

FIG. 1B is a hardware block diagram of another embodiment of the invention incorporating the floating switch drivers 158, 168 into selectable signal inputs of an operational amplifier to provide a signal summer, differencer or selector 150. An op amp 172 is shown with its non-inverting input coupled to $V_{cm}$ 174. A feedback loop incorporating resistor 176 couples the output 180 of the op amp to the inverting input thereof. Two signal inputs 152 and 162 are switchably coupled to the inverting input 170 of the op amp via an associated switch and driver combination. Signal source 152 is coupled via resistor 154 and bipolar transistor 156 to the inverting input of the op amp. Switch 156 is controlled via a drive signal delivered to the base thereof by floating switch driver 158. Signal source 162 is coupled via resistor 164 and bipolar transistor 166 to the inverting input of the op amp. Switch 166 is controlled via a drive signal delivered to the base thereof by floating switch driver 168.

Figure 2A:
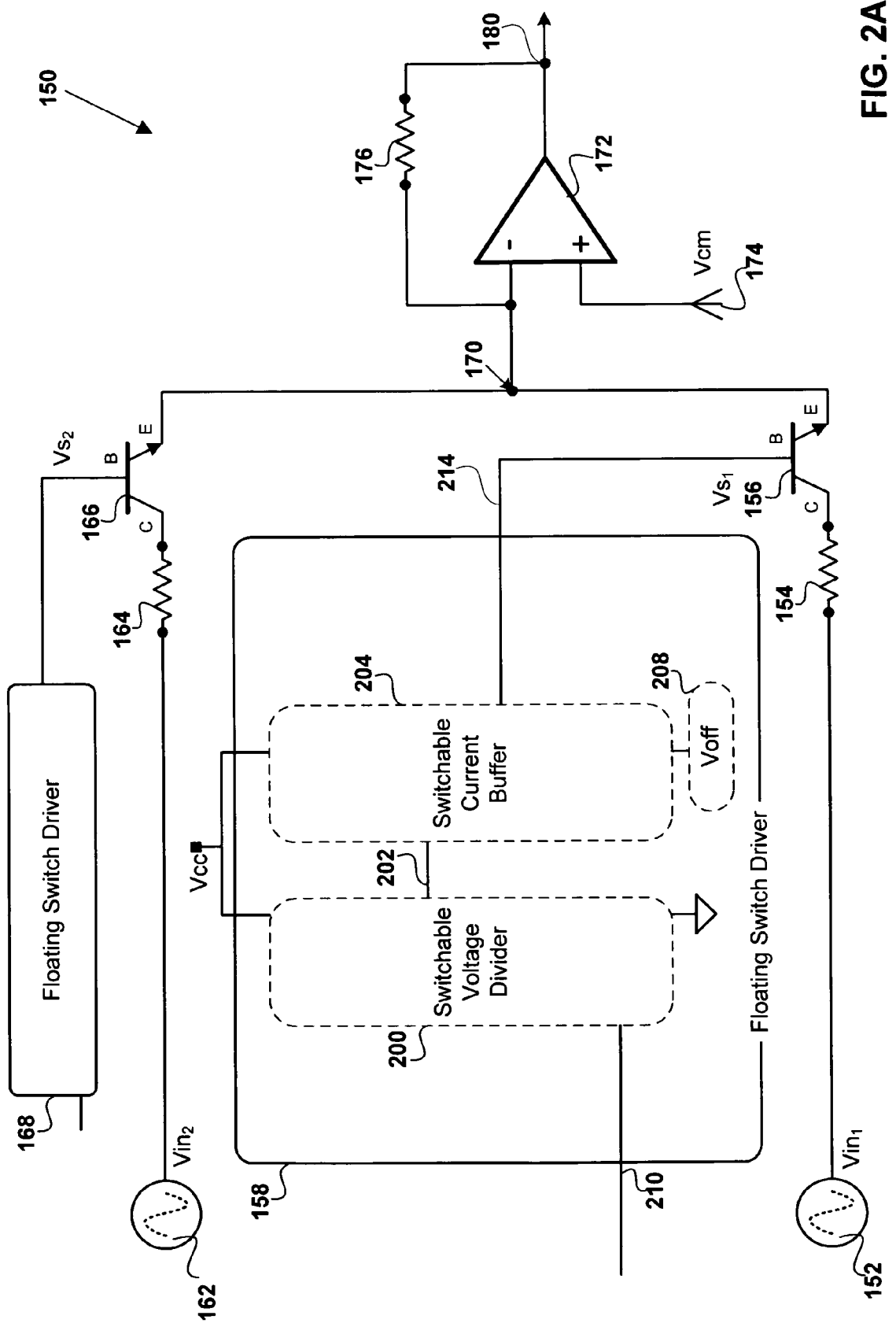
FIG. 2A is a hardware block diagram of the floating switch driver in the analog circuit of FIG. 1B.

FIG. 2A is a hardware block diagram of the floating switch driver in the analog circuit of FIG. 1B. The floating switch driver 158 comprises an output 214 coupled to the base of BJT 156 and an input 210 which receives the input signal which drives the floating switch driver into one of two states, i.e. "On" and "Off". The floating switch in this embodiment of the invention utilizes a switchable voltage divider 200 coupled between a positive voltage source Vcc and ground and a switchable current buffer 204 coupled between the positive voltage source Vcc and a voltage sink 208 having a voltage level "Voff". The switchable voltage driver has an input 210 and an output 202. The output of the switchable voltage divider 200 is coupled to the input of the switchable current buffer to control the buffer thereof. The current buffer output is coupled to the output 214 of the floating switch driver 158. The switchable voltage divider 200 provides one of two positive voltage levels at its output 202 responsive to a signal at its input 210. These two positive voltage levels are used to turn the switchable current buffer on or off. At the higher of these two positive output voltage levels of the voltage divider the switchable current buffer responds by delivering the limited forward current to the base of the BJT 156. This limited forward current drives the BJT into saturation, effectively coupling the signal source 152 to the inverting input 170 of the op amp 172. At the lower of these two positive voltage levels of the switchable voltage divider the current buffer is decoupled from the output 214 of the floating switch driver which is instead coupled directly to the voltage sink 208 having a level "Voff" which drives the transistor 156 to an open connection in which the signal source 152 is decoupled from the inverting input of the op amp. The voltage level "Voff" is selected to be not less than the reverse breakdown voltage nor greater than the forward voltage drop of the bipolar transistor 156.

EXAMPLE 1

Figure 2B:
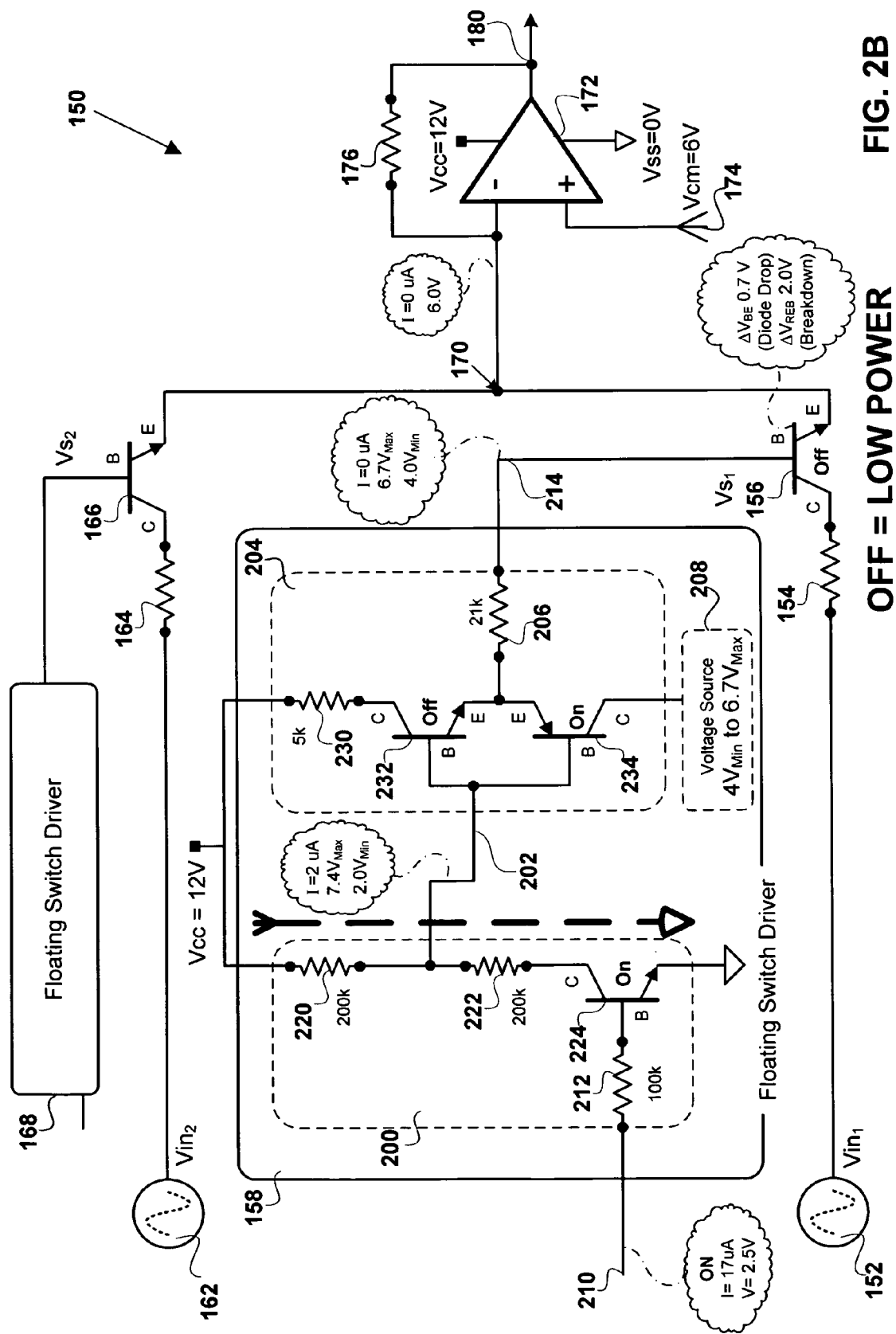
FIG. 2B is a detailed hardware block diagram of the floating switch driver in the analog circuit of FIG. 2A in the "Off" state.
Figure 2C:
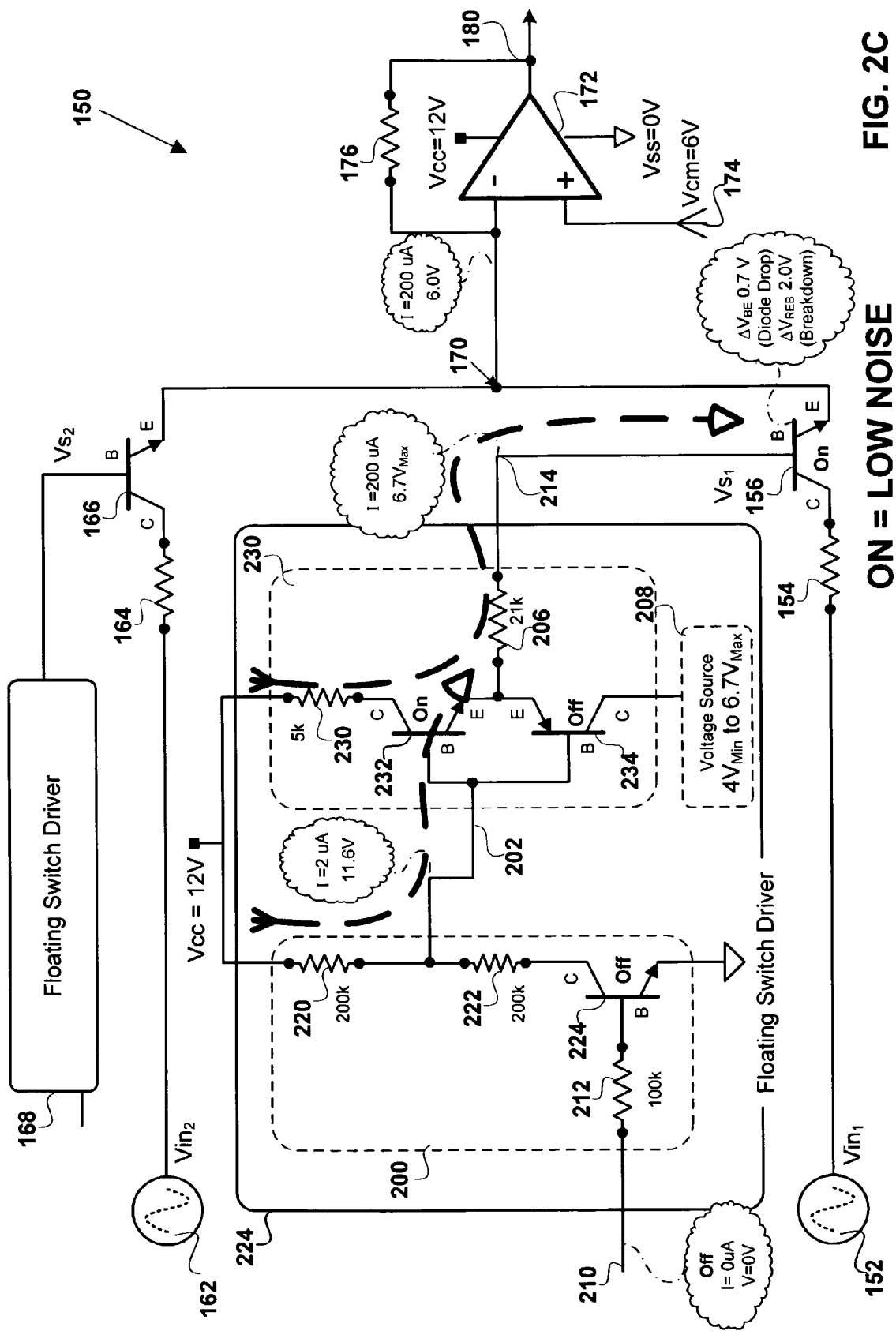
FIG. 2C is a detailed hardware block diagram of the floating switch driver in the analog circuit of FIG. 2A in the "On" state.

The following FIGS. 2B-2C show detailed voltage, current, and resistance values for an embodiment of the floating switch driver in the analog circuit of FIG. 2A. In this example the op amp 172 is coupled to a voltage source Vcc=12V and sink Vss=0V. In this embodiment of the invention, the switchable voltage divider 200 comprises resistors 220-222 coupled in series to one another between voltage source Vcc=12V and ground via BJT transistor 224. The voltage divider resistors 220 and 222 each have resistances of 200 kΩ in this example. The transistor 224 is base coupled via 100 kΩ resistor 212 to the control input 210 of the floating switch driver 158. The output 202 of the voltage divider at the common node between resistors 220-222 is coupled to the input of the switchable current buffer 204. In this embodiment of the invention the switchable current buffer comprises complementary push pull BJT transistors 232 and 234 coupled between the positive voltage supply Vcc=12V and the voltage sink 208 having a voltage level "Voff". The push transistor 232 is an "npn" type and the pull transistor 234 is of "pnp" type. The bases of the push pull transistor pair are coupled to the output 220 of the voltage divider 200. A resistor 230 having a value of 5 kΩ resistively couples the push transistor 232 to the voltage source Vcc. The voltage level "Voff" is selected to be not less than the reverse breakdown voltage nor greater than the forward voltage drop of the bipolar transistor 156. In this case the reverse breakdown voltage is: $(V_{cm}-\Delta V_{REB})=6V-2V=4V$, where $-\Delta V_{REB}$ is the voltage drop under reverse breakdown conditions. The forward voltage drop is: $(V_{cm}+\Delta V_{BE})=6V+0.7=6.7V$, where $\Delta V_{BE}$ is the voltage drop across the base-emitter diode of the BJT 156. Thus the voltage sink 208 "Voff" has a level between 4.0V and 6.7 Volts.

FIG. 2B is a detailed hardware block diagram of the floating switch driver in the analog circuit of FIG. 2A in the "Off" state. Under the conditions stated above and in the "Off" state of the floating switch driver 158 the voltage and current conditions at key nodes in the circuit are as follows. The signal at floating switch driver input 210 has a voltage of 2.5V and a current of 17 uA. The voltage and current at the output of the switchable voltage divider are 2.0V-to-7.4V and a current of 2 uA flowing through the voltage divider to ground. The voltage range at the output of the voltage divider is determined by the requirement that the voltage not be less than two reverse breakdown voltages below the common mode voltage Vcm nor greater than Vcm plus two forward voltage drops. The voltage at the output 214 of the floating switch driver is between 4.0V and 6.7V, i.e. "Voff". Under these conditions switch 156 decouples the signal source 152 from the inverting input of the op amp 172. This driver switch combination then delivers no current to the inverting input of the op amp. Any number of signal inputs to the op amp may be switchably controlled in this manner.

FIG. 2C is a detailed hardware block diagram of the floating switch driver in the analog circuit of FIG. 2A in the "On" state. Under the conditions stated above and in the "On" state of the floating switch driver 158 the voltage and current conditions at key nodes in the circuit are as follows. The signal at floating switch driver input 210 has a voltage of 0.0V and a current of 0 uA. The voltage and current at the output of the switchable voltage divider is 11.6V and a current of 2 uA. This current of 2 uA is sufficient to drive the base of the current buffers push transistor 232 to draw the required current of 200 uA to the floating switches output 214 from the voltage source VCC which drives transistor 156 to couple the signal source 152 to the inverting input of the op amp 172. This driver switch combination then delivers 200 uA of current at 6.0V to the inverting input of the op amp.

The embodiments of the invention discussed above include "npn" type BJTs as the switching transistor due to their superior current carrying characteristics. In alternate embodiments of the invention the switching transistor may be "pnp" type with the appropriate alteration of the drive signal delivered by the floating switch driver.

The foregoing description of a preferred embodiment of the invention has been presented for purposes of illustration and description. It is not intended to be exhaustive or to limit the invention to the precise forms disclosed. Obviously many modifications and variations will be apparent to practitioners skilled in this art. It is intended that the scope of the invention be defined by the following claims and their equivalents.

What is claimed is:

1. A circuit for switchably coupling a signal source to an amplifier comprising:
    a bipolar transistor configured to switchably couple the signal source to the high impedance load responsive to a driver signal applied to a base thereof; and
    a floating switch driver having a control input and an output terminal coupled to the base of the bipolar transistor to supply the driver signal comprising a limited forward current during a first state of the floating switch driver outputting a high logic level driver signal and during a second state of the floating switch driver outputting a low logic level driver signal having a voltage "Voff" not less than $V_{cm}-\Delta V_{REB}$ nor greater than $V_{cm}+\Delta V_{BE}$ where Vcm is a common mode voltage at an emitter of the bipolar transistor and $\Delta V_{REB}$ and $\Delta V_{BE}$ are a reverse breakdown voltage and a forward voltage drop respectively, across a base-emitter connection of the bipolar transistor and wherein the floating switch driver further comprises;
a switchable current buffer coupled between a non-zero voltage source "Vcc" and a voltage sink having the fixed non-zero voltage "Voff", to supply the driver signal at the output terminal by uncoupling the output terminal from the voltage sink in the first state and by coupling the output terminal to the voltage sink in the second state.

2. The circuit of claim 1, wherein the switchable current buffer of the floating switch driver further comprises:
a pair of complementary push and pull transistors serially coupled to one another between the non-zero voltage source "Vcc" and the non-zero voltage sink having the fixed voltage "Voff", to supply the driver signal at the output terminal there between by coupling the output terminal exclusively via the push transistor to the voltage source in the first state and by coupling the output terminal exclusively via the pull transistor to the voltage sink in the second state.

3. The circuit of claim 2, wherein the pair of complementary push and pull transistors comprise bipolar transistors.

4. The circuit of claim 1, wherein the floating switch driver further comprises:
the switchable current buffer including a pair of complementary push and pull bipolar transistors serially coupled to one another between a non-zero voltage source "Vcc" and a non-zero voltage sink having the fixed voltage "Voff", to supply the driver signal at the output terminal there between by coupling the output terminal exclusively via the push transistor to the voltage source in the first state and by coupling the output terminal exclusively via the pull transistor to the voltage sink in the second state; and
a voltage divider switchably coupled to ground and an output node of the voltage divider coupled to bases of the pair of complementary push and pull bipolar transistors to control the coupling and uncoupling of the push and pull transistors to the output terminal.

5. A floating switch driver for a bipolar transistor switch comprising:
a switchable current buffer having a control input and an output terminal configured to couple to the base of the bipolar transistor to supply a driver signal thereto, comprising a limited forward current during a first state of the floating switch driver outputting a high logic level driver signal and during a second state of the floating switch driver outputting a low logic level driver signal having a voltage "Voff" not less than $V_{cm}-\Delta V_{REB}$ nor greater than $V_{cm}+\Delta V_{BE}$ where Vcm is a common mode voltage at an emitter of the bipolar transistor and $\Delta V_{REB}$ and $\Delta V_{BE}$ are a reverse breakdown voltage and a forward voltage drop respectively, across a base-emitter connection of the bipolar transistor, and wherein the switchable current buffer further comprises:
a pair of complementary push and pull transistors serially coupled to one another between a non-zero voltage source "Vcc" and a non-zero voltage sink having the fixed voltage "Voff", to supply the driver signal at the output terminal there between by coupling the output terminal exclusively via the push transistor to the voltage source in the first state and by coupling the output terminal exclusively via the pull transistor to the voltage sink in the second state.

6. The floating switch driver of claim 5 wherein the floating switch driver further comprises:
a voltage divider switchably coupled to ground and an output node of the voltage divider coupled to bases of the pair of complementary push and pull bipolar transistors to control the coupling and uncoupling of the push and pull transistors to the output terminal.

7. A switch comprising:
an operational amplifier having a pair of inputs and an output;
a bipolar transistor switchably coupling and uncoupling a signal source to/from one of the pair of inputs of the operational amplifier responsive to a driver signal applied to a base thereof; and
a floating switch driver having a control input and an output terminal coupled to the base of the bipolar transistor to supply the driver signal comprising a limited forward current during a first state of the floating switch driver outputting a high logic level driver signal and during a second state of the floating switch driver outputting a low logic level driver signal having a voltage "Voff" not less than $V_{cm}-\Delta V_{REB}$ nor greater than $V_{cm}+\Delta V_{BE}$ where Vcm is a common mode voltage at an emitter of the bipolar transistor and $\Delta V_{REB}$ and $\Delta V_{BE}$ are a reverse breakdown voltage and a forward voltage drop respectively, across a base-emitter connection of the bipolar transistor and wherein the floating switch driver further comprises:
a switchable current buffer coupled between a non-zero voltage source "Vcc" and a voltage sink having the fixed non-zero voltage "Voff", to supply the driver signal at the output terminal by uncoupling the output terminal from the voltage sink in the first state and by coupling the output terminal to the voltage sink in the second state.

8. The switch circuit of claim 7, wherein the switchable current buffer further comprises:
a pair of complementary push and pull transistors serially coupled to one another between the non-zero voltage source "Vcc" and the non-zero voltage sink having the fixed voltage "Voff", to supply the driver signal at the output terminal there between by coupling the output terminal exclusively via the push transistor to the voltage source in the first state and by coupling the output terminal exclusively via the pull transistor to the voltage sink in the second state.

9. The switch of claim 8, wherein the pair of complementary push and pull transistors comprise bipolar transistors.

10. The switch of claim 7, wherein the floating switch driver further comprises:
the switchable current buffer including a pair of complementary push and pull bipolar transistors serially coupled to one another between the non-zero voltage source "Vcc" and the non-zero voltage sink having the fixed voltage "Voff", to supply the driver signal at the output terminal there between by coupling the output terminal exclusively via the push transistor to the voltage source in the first state and by coupling the output terminal exclusively via the pull transistor to the voltage sink in the second state; and
a voltage divider switchably coupled to ground and the output node of the voltage divider coupled to bases of the pair of complementary push and pull bipolar transistors to control the coupling and uncoupling of the uncoupling of the push and pull transistors to the output terminal.

11. A switch, comprising:
an op amp having a pair of inputs and an output;

a resistor coupled in a feedback loop from the output of the op amp to a selected one of the inputs of the op amp;

a bipolar transistor coupled in series with the resistor in the feedback loop to switchably couple and uncouple the feedback loop responsive to a driver signal applied to a base thereof; and a floating switch driver having a control input and an output terminal coupled to the base of the bipolar transistor to supply the driver signal comprising a limited forward current during a first state of the floating switch driver outputting a high logic level driver signal and during a second state of the floating switch driver outputting a low logic level driver signal having a voltage "Voff" not less than $V_{cm} - \Delta V_{REB}$ nor greater than $V_{cm} + \Delta V_{BE}$ where Vcm is a common mode voltage at an emitter of the bipolar transistor and $\Delta V_{REB}$ and $\Delta V_{BE}$ are a reverse breakdown voltage and a forward voltage drop respectively, across a base-emitter connection of the bipolar transistor and wherein the floating switch driver further comprises:

a switchable current buffer coupled between a non-zero voltage source "Vcc" and a voltage sink having the fixed non-zero voltage "Voff", to supply the driver signal at the output terminal by uncoupling the output terminal from the voltage sink in the "On" state and by coupling the output terminal to the voltage sink in the "Off" state.

12. The switch circuit of claim 11, wherein the switchable current buffer further comprises:

a pair of complementary push and pull transistors serially coupled to one another between the non-zero voltage source "Vcc" and the non-zero voltage sink having the fixed voltage "Voff", to supply the driver signal at the output terminal there between by coupling the output terminal exclusively via the push transistor to the voltage source in the first state and by coupling the output terminal exclusively via the pull transistor to the voltage sink in the second state.

13. The switch of claim 12, wherein the pair of complementary push and pull transistors comprise bipolar transistors.

14. The switch of claim 11, wherein the floating switch driver further comprises:

the switchable current buffer including a pair of complementary push and pull bipolar transistors serially coupled to one another between a non-zero voltage source "Vcc" and a non-zero voltage sink having the fixed voltage "Voff", to supply the driver signal at the output terminal there between by coupling the output terminal exclusively via the push transistor to the voltage source in the first state and by coupling the output terminal exclusively via the pull transistor to the voltage sink in the second state; and a voltage divider switchably coupled to ground and the output node of the voltage divider coupled to bases of the pair of complementary push and pull bipolar transistors to control the coupling and uncoupling of the uncoupling of the push and pull transistors to the output terminal.

15. A floating switch driver for a bipolar transistor switch comprising:

a switchable current buffer coupled between a non-zero voltage source "Vcc" and a voltage sink having a fixed non-zero voltage "Voff", and having a control input and an output terminal configured to couple to the base of the bipolar transistor to supply a driver signal thereto, comprising a limited forward current during a first state of the floating switch driver outputting a high logic level driver signal and during a second state of the floating switch driver outputting a low logic level driver signal having a voltage "Voff" not less than $V_{cm} - \Delta V_{REB}$ nor greater than $V_{cm} + \Delta V_{BE}$ where Vcm is a common mode voltage at an emitter of the bipolar transistor and $\Delta V_{REB}$ and $\Delta V_{BE}$ are a reverse breakdown voltage and a forward voltage drop respectively, across a base-emitter connection of the bipolar transistor, and the switchable current buffer supplying the driver signal at the output terminal by uncoupling the output terminal from the voltage sink in the first state and by coupling the output terminal to the voltage sink in the second state.

\* \* \* \* \*